United States Patent [19]

Obara

[11] Patent Number: 5,444,667

[45] Date of Patent: Aug. 22, 1995

[54] SEMICONDUCTOR SYNCHRONOUS MEMORY DEVICE HAVING INPUT CIRCUIT FOR PRODUCING CONSTANT MAIN CONTROL SIGNAL OPERATIVE TO ALLOW TIMING GENERATOR TO LATCH COMMAND SIGNALS

[75] Inventor: Takashi Obara, Tokyo, Japan

[73] Assignee: NEC Corporation, Tokyo, Japan

[21] Appl. No.: 220,881

[22] Filed: Mar. 31, 1994

[30] Foreign Application Priority Data

Apr. 20, 1993 [JP] Japan .................................. 5-077237

[51] Int. Cl.$^6$ .............................................. G11C 8/00
[52] U.S. Cl. ...................... 365/233; 365/191; 365/194
[58] Field of Search ............... 365/233, 233.5, 191, 365/194

[56] References Cited

U.S. PATENT DOCUMENTS 4,970,693 11/1990 Nozaki ........................ 365/233 X
5,018,111 5/1991 Madland ........................ 365/233
5,311,483 5/1994 Takasugi ........................ 365/233

OTHER PUBLICATIONS

Patent Abstracts of Japan, vol. 13, No. 361, 11 Aug. 1989.
Electronic Design, vol. 41, No. 4, Feb. 1993, pp. 45–49, Bursky, "Synchronous DRAMS Clock A 100 MHZ".

*Primary Examiner*—Joseph A. Popek
*Assistant Examiner*—Son Mai
*Attorney, Agent, or Firm*—Sughrue, Mion, Zinn, Macpeak & Seas

[57] ABSTRACT

A synchronous dynamic random access memory device latches external command signals for defining the internal sequence, and an input circuit produces an internal control signal from a system clock signal and a clock enable signal for latching the external command signals, wherein the input circuit maintains the internal control signal in an active level for a predetermined time period regardless of the duty ratio of the external clock signal so that a malfunction hardly takes place.

5 Claims, 7 Drawing Sheets

SEMICONDUCTOR SYNCHRONOUS MEMORY DEVICE HAVING INPUT CIRCUIT FOR PRODUCING CONSTANT MAIN CONTROL SIGNAL OPERATIVE TO ALLOW TIMING GENERATOR TO LATCH COMMAND SIGNALS

FIELD OF THE INVENTION

This invention relates to a semiconductor synchronous memory device and, more particularly, to an input circuit incorporated in a semiconductor synchronous memory device for a burst access.

DESCRIPTION OF THE RELATED ART

A semiconductor memory device forms an electronic system together with a central processing unit, a gate array etc. The system components are usually synchronous with a system clock. However, the semiconductor memory device is asynchronous with the system clock. Namely, the semiconductor memory device is connected with the other system components through a power supply pin, a ground pin, an address port, an input and output data port and a control signal port, and a row address strobe signal RAS, a column address strobe signal CAS, a write enable signal WE and an output enable signal OE are supplied to the control signal port for controlling the semiconductor memory device. The voltage level of each external enable signal RAS, CAS, WE or OE defines an internal status of the semiconductor memory device, and the function starting with the external enable signal proceeds without the system clock.

Semiconductor device manufacturers have improved the central processing unit and other system components in data processing/transmission speed, and the speed-up has been also requested for the semiconductor memory device.

One of the approaches results in a synchronous dynamic random access memory device, and the synchronous dynamic random access memory device is controlled with a system clock signal as similar to the central processing unit. In detail, command signals are supplied to the synchronous dynamic random access memory device in synchronism with the system clock signal, and the synchronous dynamic random access memory device decodes the command signal for controlling the internal sequences. External address signals and an input data signal are also supplied to the synchronous dynamic random access memory device in synchronism with the system clock signal.

The synchronous dynamic random access memory device successively delivers data bits stored therein to a destination with a single column address signal, and such a successive delivery is called as a burst access. The burst access improves the average access speed four times faster than a prior art fast page-mode dynamic random access memory device.

As will be understood, the synchronous dynamic random access memory device is attractive to a system designer because of a high access speed, and the external command signals select an internal sequence for the synchronous dynamic random access memory device.

For example, a row address strobe signal RAS of an active level is replaced with an external command signal "ACTIVE", and the external command "ACTIVE" causes the synchronous dynamic random access memory device to latch a row address signal, then starting a refreshing sequence for the memory cells coupled with the word line assigned the row address indicated by the row address signal, finally completing the other functions before a column selection.

On the other hand, the row address strobe signal RAS of an inactive level is replaced with an external command signal "PRECHARGE", and the external command signal "PRECHARGE" causes the synchronous dynamic random access memory device to de-energize the selected word line, precharge the bit line pairs and complete the other sequences before the data delivery.

An asynchronous dynamic random access memory device starts a refreshing sequence in an interval between data accesses with a CAS-Before-RAS entry timing, i.e., a column address strobe signal changed to the low level before a change of the row address strobe signal to the low level, and the CAS-Before-RAS entry timing is replaced with an external command signal "REFRESH".

The change of the column-address strobe signal after the change of the row address strobe signal is replaced with an external command signal "READ", and the external command signal "READ" causes the synchronous dynamic random access memory device to selectively connecting the bit line pairs with an input/output data buffer unit.

In the standard dynamic random access memory device, a write enable signal WE allows the input/output data buffer unit to supply a potential difference indicative of an input data bit to a selected bit line pair.

These external command signals are latched in synchronism with the system clock signal, and the set-up time and the hold time for the external command signals are of the order of 2 nano-second. Thus, the window is so narrow that the first input stages of the address port and the first input stages of the data port are enabled at all times. The pins are ten odd to tens, and the associated first input stages consumes a large amount of current. Therefore, the first problem inherent in the prior art synchronous dynamic random access memory device is the large amount of current consumed in the first input stages.

The external command signals are sequentially supplied to the synchronous dynamic random access memory device, and define the internal sequences. If the duty ratio of the system clock is fluctuated, the synchronous dynamic random access memory device tends to fail to latch the external command signals, and a malfunction takes place in the synchronous dynamic random access memory device. The second problem inherent in the prior art synchronous dynamic random access memory device is the malfunction due to the variable duty ratio of the system clock signal.

SUMMARY OF THE INVENTION

It is therefore an important object of the present invention to provide an input circuit which is free from the problems inherent in the prior art semiconductor memory device.

In accordance with the present invention, there is provided a synchronous semiconductor memory device comprising: a) a memory cell array implemented by a plurality of addressable memory cells; b) an input and output unit for supplying data bits from and to the memory cell array; c) an addressing system responsive to external address signals for selectively coupling the input and output unit with the plurality of addressable memory cells; d) a timing generator responsive to external command signals for controlling the input and output unit and the addressing system; and e) an input circuit responsive to an external clock signal and an external clock enable signal for producing a main internal control signal, the main internal control signal causing the timing generator to latch the external command signals, the input circuit having e-1) a first input stage assigned to the external clock signal, and operative to produce an internal clock signal synchronous with the external clock signal, e-2) a second input stage assigned to the external clock enable signal, and operative to produce an internal clock enable signal synchronous with the external clock enable signal, e-3) a first controller responsive to the internal clock signal for producing a first internal control signal maintained at a first level for a predetermined time period, and e-4) a second controller responsive to the first internal control signal for introducing a time delay between the internal clock enable signal and a second internal control signal, the second internal control signal allowing the first controller to produce the main internal control signal from the internal clock signal maintained at a first level for the predetermined time period.

BRIEF DESCRIPTION OF THE DRAWINGS

The features and advantages of the input circuit incorporated in the synchronous semiconductor memory device according to the present invention will be more clearly understood from the following description taken in conjunction with the accompanying drawings in which.

DESCRIPTION OF THE PREFERRED EMBODIMENT

Figure 1:
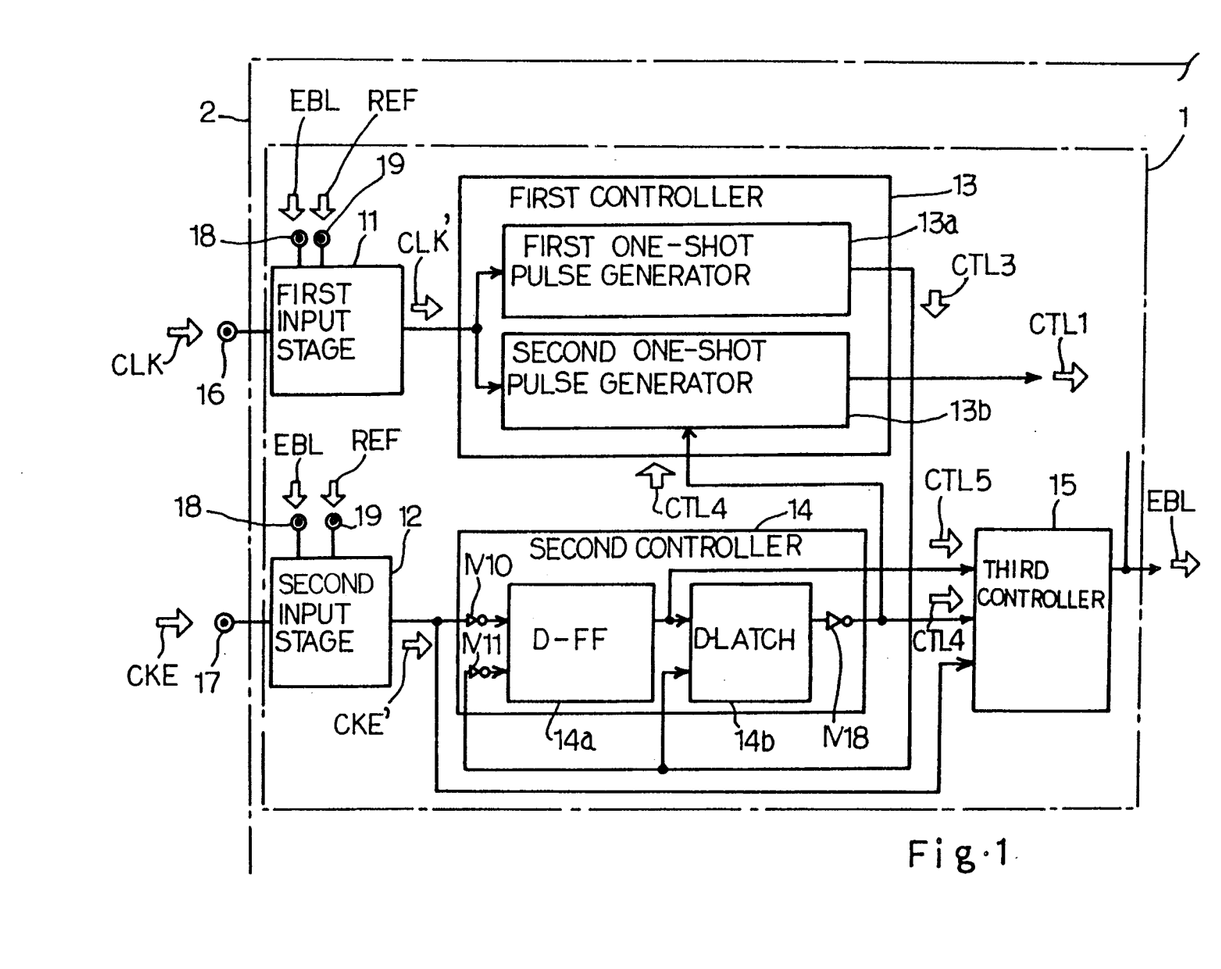
FIG. 1 is a block diagram showing the arrangement of an input circuit incorporated in a synchronous .dynamic random access memory device according to the present invention.

Referring first to FIG. 1 of the drawings, an input circuit I embodying the present invention is incorporated in a synchronous dynamic random access memory device fabricated on a single semiconductor chip 2. The input circuit 1 largely comprises first and second input stages 11 and 12 and first, second and third controllers 13, 14 and 15, and produces internal control signal CTL1 and an enable signal EBL.

The first input stage 11 is connected with a clock pin 16 assigned to the system clock signal CLK, and the second input stage 12 is connected with a control signal pin 17 assigned to a clock enable signal CKE. The first input stage 11 is similar in arrangement to the second input stage 12.

Figure 2:
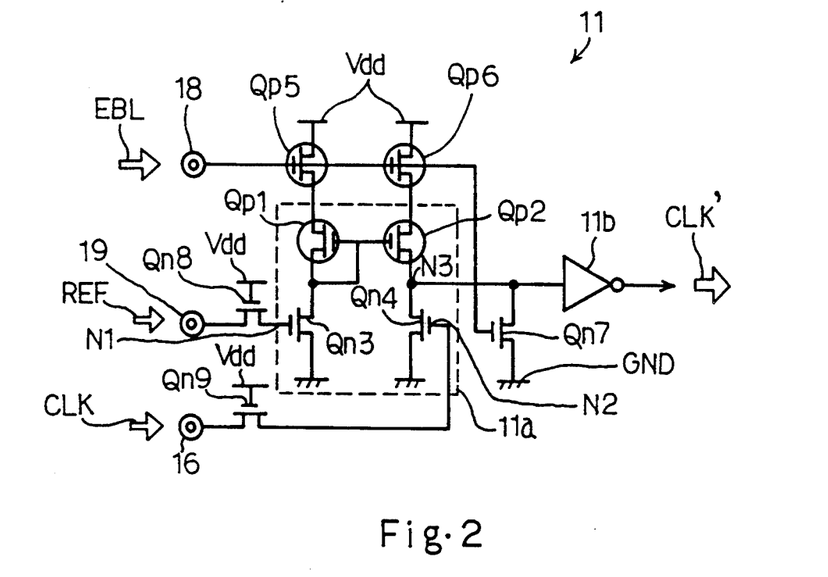
FIG. 2 is a circuit diagram showing the arrangement of each first input stage incorporated in the input circuit.

Referring to FIG. 2 of the drawings, the first input stage 11 comprises a current mirror circuit 11a implemented by two series combinations of p-channel enhancement type load transistors Qp1/Qp2 and n-channel enhancement type amplifying transistors Qn3/Qn4. The gate electrodes of the n-channel enhancement type amplifying transistors Qn3 and Qn4 serve as a pair of input nodes N1 and N2, and a potential difference between the input nodes N1 and N2 is converted into an output voltage signal at an output node N3. If the voltage level at the input node N2 is lower than the voltage level at the input node N1, the current mirror circuit 11a produces a high voltage level at the output node N3. On the other hand, if the voltage level at the input node N2 is higher than the voltage level at the input node N1, the current mirror circuit 11a produces a low voltage level at the output node N3.

The first input stage 11 further comprises a pair of p-channel enhancement type switching transistors Qp5 and Qp6 coupled between a power voltage line Vdd and the current mirror circuit 11a, an n-channel enhancement type switching transistor Qn7 coupled between the output node N3 and a ground voltage line GND, and an inverter 11b coupled with the output node N3. The p-channel enhancement type switching transistors Qn5 and Qn6 and the n-channel enhancement type switching transistor Qn7 are enabled with the enable signal EBL supplied to a control signal node 18, and complementarily turn on and off. Namely, while the enable signal EBL is in a high or positive power voltage level, the p-channel enhancement type switching transistors Qp5 and Qp6 isolate the current mirror circuit 11a from the power voltage line Vdd, and the n-channel enhancement type switching transistor Qn7 maintains the output node N3 at the ground voltage level. On the other hand, if the enable signal EBL goes down to a low or ground voltage level, the n-channel enhancement type switching transistor Qn7 turns off, and the p-channel enhancement type switching transistors Qp5 and Qp6 supply current to the current mirror circuit. Then, the current mirror circuit 11a converts the potential difference between the input nodes N1 and N2 into the output voltage signal at the output node N3, and the inverter 11b produces a regulated clock signal CLK'. A predetermined time delay is introduced between the system clock signal CLK and the regulated clock signal CLK'.

The current mirror circuit 11a is not activated at all times, but is activated while the enable signal EBL is staying at the low voltage level. This results in reduction in current consumption.

The first input stage 11 further comprises n-channel enhancement type protection transistors Qn8 and Qn9 coupled between the input nodes N1/N2 and a control signal node 19 and the clock signal pin 16, and the system clock signal CLK and a reference signal REF are assigned to the signal pins 16 and the signal node 19, respectively. The positive power voltage level Vdd is supplied to the gate electrodes of the n-channel enhancement type protection transistors Qn8 and Qn9. The n-channel enhancement type protection transistor Qn9 serves as a limiter against undesirable surge voltage, and the n-channel enhancement type protection transistor Qn8 balances the reference signal REF with the clock signal CLK.

The second input stage 12 is similarly arranged, and produces a regulated clock enable signal CKE', and a time delay is also introduced.

Figure 3:
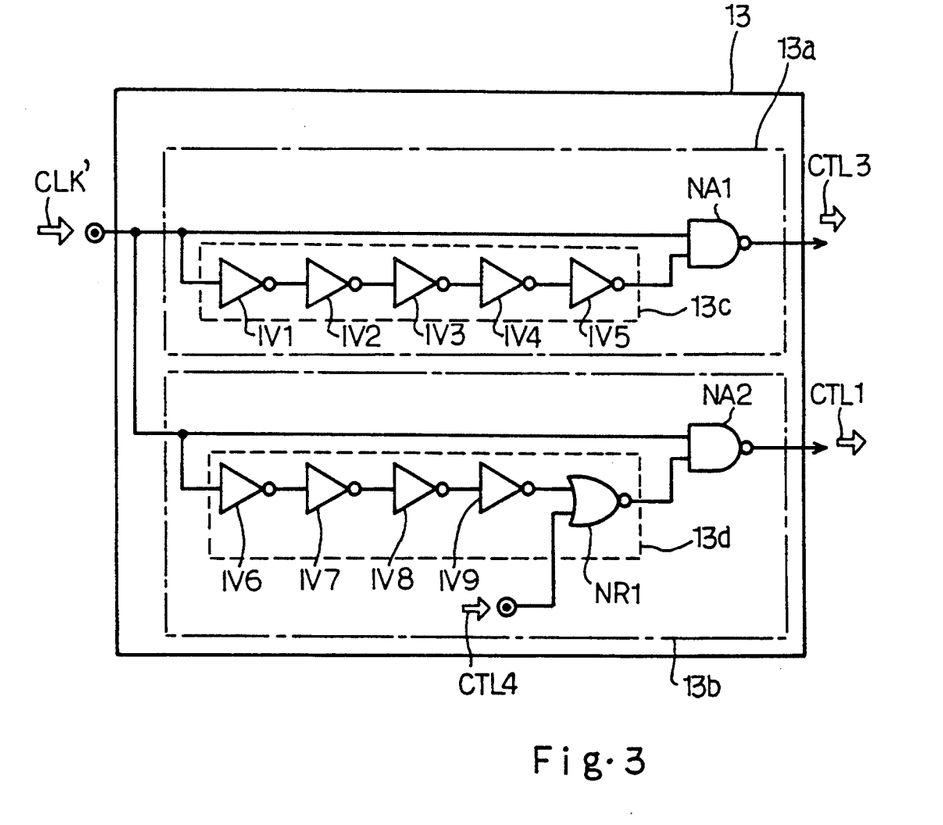
FIG. 3-is a logic diagram showing the arrangement of a first controller incorporated in the input circuit.

Turning to FIG. 3 of the drawings, the first controller 13 has a first one-shot pulse generator 13a and a second one-shot pulse generator 13b, and the regulated clock signal CLK' is supplied from the first input stage 11 to the first and second one-shot pulse generators 13a and 13b.

The first one-shot pulse generator 13a comprises a delay circuit 13c and a NAND gate NA1, and the delay circuit 13c is implemented by a series combination of inverters IV1, IV2, IV3, IV4 and IV5. However, the first one-shot pulse generator 13a may be constituted by a NOR gate, the delay circuit 13c and another inverter. The number of the inverters IV1 to IV5 defines time delay introduced in the propagation of the regulated clock signal CLK' and for this reason, the delay circuit 13c may be implemented by another odd inverters.

The regulated clock signal CLK' is supplied in parallel to an input node of the NAND gate NA1 and the delay circuit 13c. When the regulated clock signal CLK' is changed to the high voltage level corresponding to logic "1" level, the NAND gate NA1 is enabled. However, the delay circuit 13c keeps the other input node of the NAND gate NA1 low, and the NAND gate NA1 maintains an internal control signal CTL3 at the high voltage level. However, when the regulated clock signal CLK' arrives at the other input node of the NAND gate NA1 through the delay circuit 13c, the NAND gate NA1 changes the internal control signal CTL3 to the low voltage level. After the predetermined time period, the NAND gate NA1 recovers the internal control signal CTL3 to the high voltage level, and, for this reason, the internal control signal CTL3 is a one-shot pulse having a time interval between the leading and trailing edges determined by the delay circuit 13c.

The second one-shot pulse generator 13b comprises a NAND gate NA2 and a delay circuit 13d, and the delay circuit 13d is implemented by a series combination of inverters IV6, IV7, IV8 and IV9 and a NOR gate NR1. In other words, the inverter IV5 of the delay circuit 13c is replaced with the NOR gate NR1, and the NOR gate NR1 is enabled with an internal control signal CTL4 produced by the second controller 14. In the delay circuit 13d, the total number of inverters IV6 to IV9 and the NOR gate NR1 defines time delay introduced in the propagation of the regulated clock signal CLK'.

While the internal control signal CTL4 is in the high voltage level, the NOR gate NR1 fixes the output signal thereof to the low voltage level, and the NAND gate NA2 fixes the internal control signal CTL1 to the high voltage level. On the other hand, if the internal control signal CTL4 is shifted to the low voltage level, the NOR gate NR1 is enabled, and serves as an inverter. For this reason, the second one-shot pulse generator 13b is equivalent to the first one-shot pulse generator 13a, and produces the internal control signal CTL1.

The delay circuit 13c is equal in the number of stages to the delay circuit 13d, and other circuit parameters of the delay circuits 13c and 13d are regulated in such a manner as to introduce the same time delay. For this reason, the internal control signal CTL1 is changed at the same timing as the internal control signal CTL3 in synchronism with the system clock CLK, and stays in the low voltage level as long as the internal control signal CTL3. The time interval of the low voltage level is determined by the time delay introduced by the delay circuits 13c and 13d. Thus, the internal control signals CTL3 and CTL1 are one-shot pulses in synchronism with the regulated clock signal CLK', and the internal control signal CTL1 is controlled with the internal control signal CTL4. The internal control signal CTL1 is used as a main internal control signal of the synchronous dynamic random access memory device. On the other hand, the status of the control signal pin 17 is introduced into the internal control signal CTL3, and the internal control signal CTL3 carries the status to the internal control signal CTL1.

It is desirable to put the NOR gate NR1 enabled with the internal control signal CTL4 at the final stage of the delay circuit 13b because of prevention of the hazard.

Figure 4:
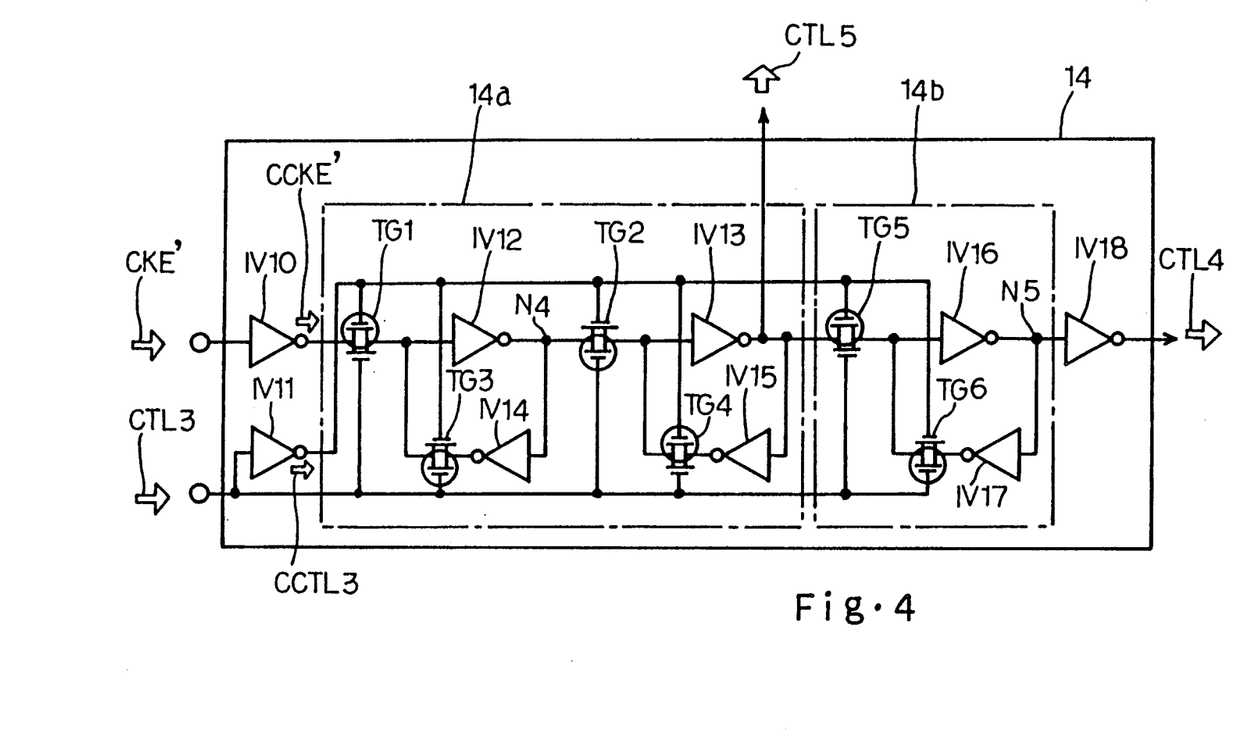
FIG. 4 is a circuit diagram showing the arrangement of a second controller incorporated in the input circuit.

Turning to FIG. 4 of the drawings, the second control circuit 14 comprises a delayed flip-flop circuit 14a, a delayed latch circuit 14b and inverters IV10 and IV11, and the clock enable signal CKE' and the internal control signal CTL3 are supplied to the second control circuit 14 for producing internal control signals CTL4 and CTL5. The regulated clock enable signal CKE' and the internal control signal CTL3 are supplied to the input nodes of the inverters IV10 and IV11, respectively, and the inverters IV10 and IV11 supplies the inverted regulated clock enable signal CCKE' and the inverted internal control signal CCTL3.

The delayed flip-flop circuit 14a comprises a series combination of a transfer gate TG1, an inverter IV12, a transfer gate TG2 and an inverter IV13, an inverter IV14 forming a primary memory loop together with the inverter IV12, a transfer gate TG3 inserted between the inverters IV12 and IV14, an inverter IV15 forming a secondary memory loop together with the inverter IV13 and a transfer gate TG4 inserted between the inverters IV13 and IV15. Each of the transfer gates TG1, TG2, TG3 and TG4 is implemented by a parallel combination of a p-channel enhancement type transfer transistor and an n-channel enhancement type transfer transistor, and the transfer gates TG1, TG2, TG3 and TG4 are gated by the internal control signal CTL3 and the inverted internal control signal CCTL3. The inverted regulated clock enable CCKE' is supplied to the input node of the transfer gate TG1, and arrives at the inverter IV12 when the internal control signal CTL3 is changed to the high voltage level. Subsequently, when the internal control signal CTL3 is changed to the low voltage level, the transfer gate TG3 turns on, and the regulated clock enable signal CKE' is stored at a node N4 of the primary memory loop.

The transfer gate TG2 turns on concurrently with the transfer gate TG3, and the regulated clock enable signal CKE' is transferred to the secondary memory loop. Then, the inverter IV13 of the secondary memory loop outputs the internal control signal CTL5 anti-phase to the regulated clock enable signal CKE'.

Thus, the delayed flip-flop circuit 14a is responsive to the internal control signal CTL3 for producing the internal control signal CTL5 from the regulated clock enable signal CKE'.

The delayed latch circuit 14b comprises a series combination of a transfer gate TG5 and an inverter IV16, an inverter IV17 forming a memory loop together with the inverter IV16 and a transfer gate TG6 inserted between the inverters IV16 and IV17, and the transfer gates TG5 and TG6 are gated by the internal control signal CTL3 and the inverted signal thereof. Namely, while the internal control signal CTL3 is in the high voltage level, the transfer gate TG5 turns on, and the inverted regulated clock enable signal CCKE' is transferred from the secondary memory loop to the inverter IV16. Subsequently, when the internal control signal CTL3 is changed to the low voltage level, the transfer gate TG5 turns off, and the transfer gate TG6 turns on, thereby storing the regulated clock enable signal CKE' at a node N5 in the memory loop.

The second controller 14 further has an inverter IV18, and the inverter produces the internal control signal CTL4 from the regulated clock enable signal CKE' at the node N5.

Thus, the delayed flip flop circuit 14a produces the internal control signal CTL5 inverted to the regulated clock enable signal CKE', and introduces a time delay equivalent to a half of the clock period of the internal control signal CTL3 between the regulated clock enable signal CKE' and the internal control signal CTL5. On the other hand, the delayed latch circuit 14b produces the internal control signal CTL4 from the regulated clock enable signal CKE', and introduces a time delay equivalent to one clock period of the internal control signal CTL3. The control signals CTL4 and CTL5 change their respective levels at the leading ends of the internal control signal CTL3.

As will be understood from the foregoing description, the first and second input stages 11 and 12 produces the regulated clock and clock enable signals CLK and CKE', and the first and second controllers 13 and 14 carries out a logical operation on the regulated clock and clock enable signals CLK and CKE' for producing the main internal control signal CTL1.

Figure 5:
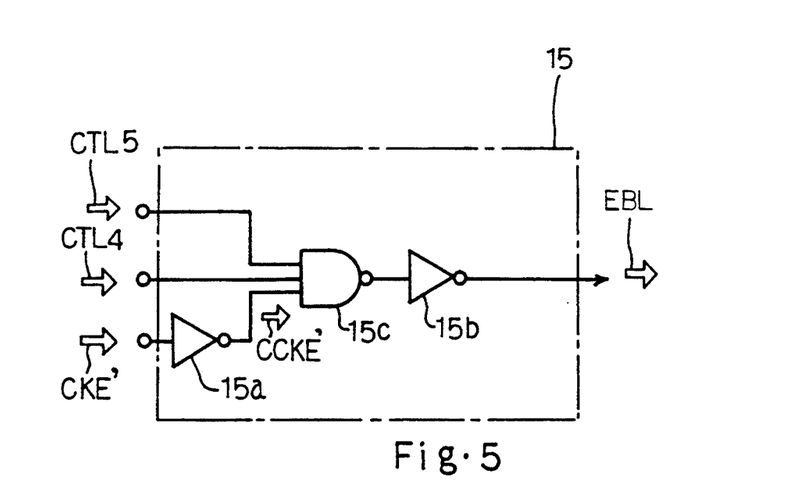
FIG. 5 is a logic diagram showing the arrangement of a third controller incorporated in the input circuit.

The third controller 15 comprises two inverters 15a and 15b and a NAND gate 15c as shown in FIG. 5, and is responsive to the internal control signals CTL4 and CTL5 and the regulated clock enable signal CKE' for producing the enable signal EBL.

Figure 6:
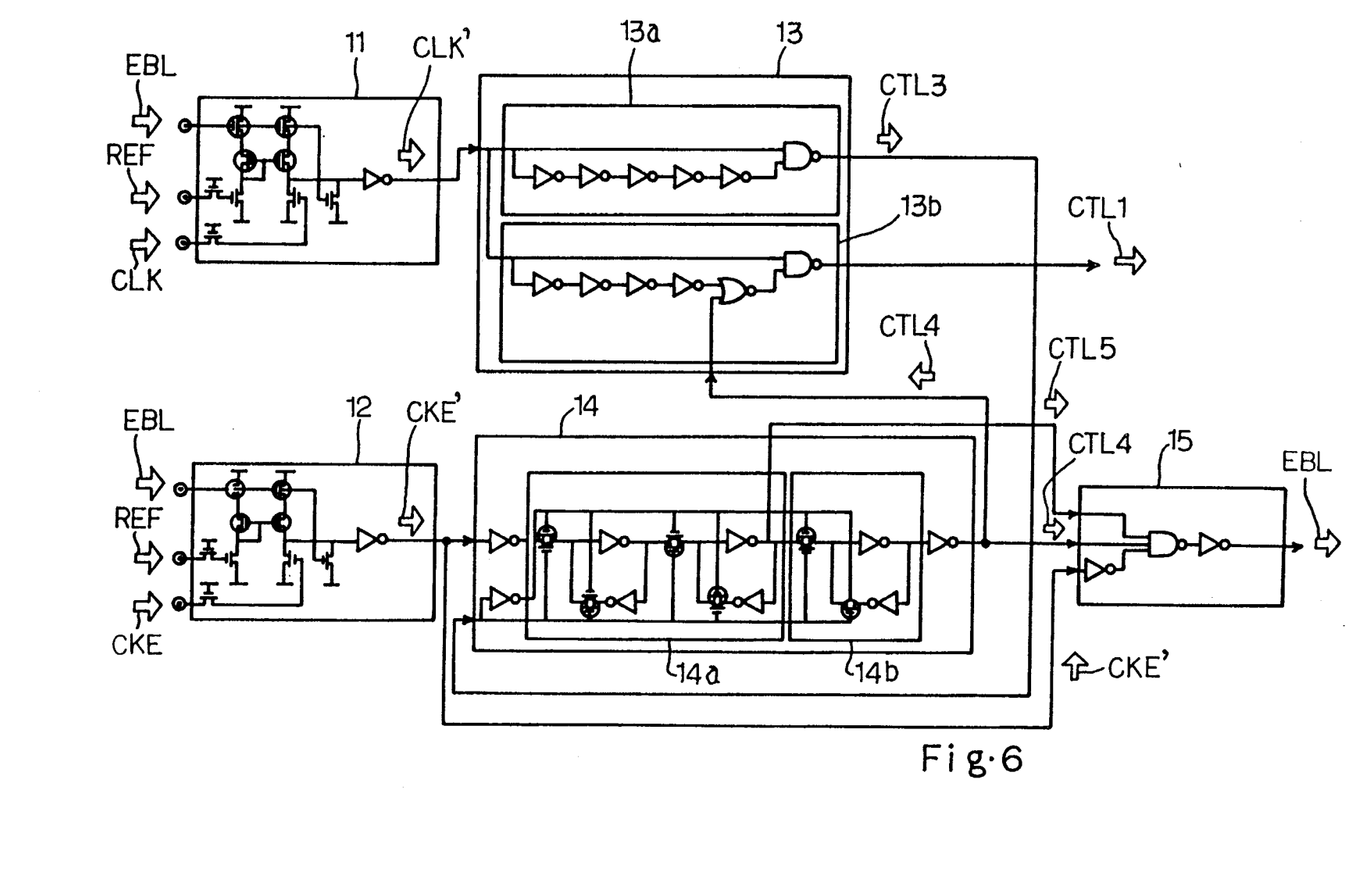
FIG. 6 is a circuit diagram showing the arrangement of the input circuit.

When FIGS. 2 to 5 are combined, the input circuit embodying the present invention is illustrated as shown in FIG. 6.

Figure 7:
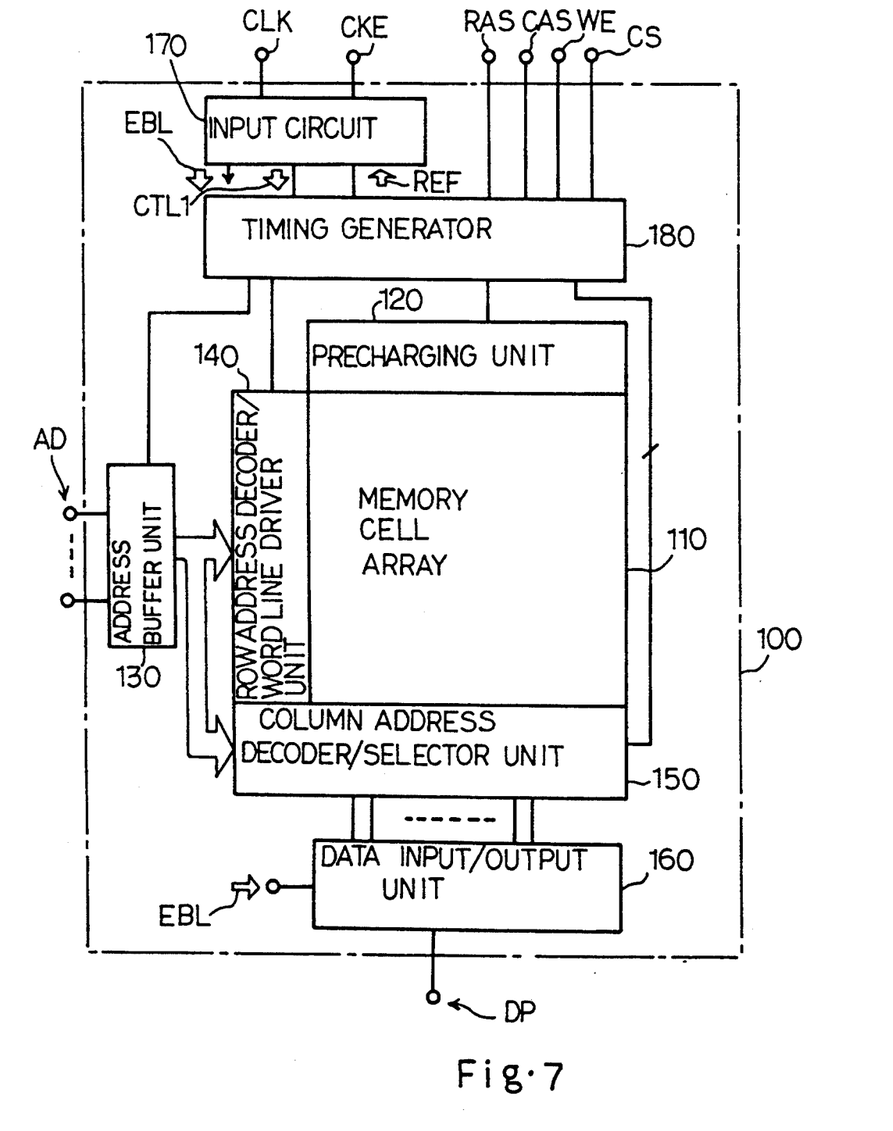
FIG. 7 is a block diagram showing the arrangement of a synchronous dynamic random access memory device having the input circuit according to the present invention.

Turning to FIG. 7 of the drawings, a synchronous dynamic random access memory device according to the present invention is fabricated on a single semiconductor chip 100, and comprises a memory cell array 110 implemented by a plurality of addressable memory cells. Though not shown in FIG. 7, word lines and bit line pairs are selectively coupled with the addressable memory cells, and row addresses and column addresses are respectively assigned to the word lines and the bit line pairs. A precharging unit 120 is coupled with the bit line pairs, and charges and balances the bit line pairs upon completion of every read-out/write-in sequence.

The synchronous dynamic random access memory device further comprises an address buffer unit 130 coupled with an address port, a row address decoder/word line driver unit 140 for selecting one of the word lines, and a column address decoder/selector unit 150 for selectively coupling the bit line pairs to a data input-/output unit 160. The column address decoder/selector unit 150 successively increments a column address indicated by an external column address predetermined times, and transfers a predetermined number of read-out data bits on the bit lines through the data input/output unit 160 to a data input/output port DP.

The synchronous dynamic random access memory device further comprises an input circuit 170 identical with the input circuit I shown in FIG. 1, and a timing generator 180 responsive to the internal control signal CTL1 for latching external command signals supplied to control signal pins RAS, CAS, WE and CS. The voltage levels at the control signal pins RAS, CAS and WE are indicative of an instruction, and the voltage level at the control signal pin CS is indicative of the validity of the instruction.

The external control signals are called as "Refresh", "Active", "Mode Register Set", "Write", "No Operation", "Read" and "Precharge", and the instructions represented by "Refresh", "Active", "Write", "Read" and "Precharge" are described in DESCRIPTION OF RELATED ART. The external command signal "Mode Register Set" causes the timing generator to establish a CAS latency, a burst length and either sequential or interleave burst access therein. The CAS latency is indicative of the number of clocks from a receipt of the external command signal Read to the first data output, and the burst length is the number of column addresses sequentially selected on the basis of the external column address signal. In the sequential burst, the lower bits of the internal column address signal is sequentially incremented, and the interleave burst causes the lower bits to change an interleave manner.

The sequential dynamic random access memory device selectively enters into a programming mode with the external command "Mode Register Set", the read out mode for a burst access with "Active" and "Read", a write-in mode with the external command signal "Write" and a refresh mode with the external command signal "Refresh". However, no further description is incorporated hereinbelow, because the present invention relates to the latch of the external command signals.

Figure 8:
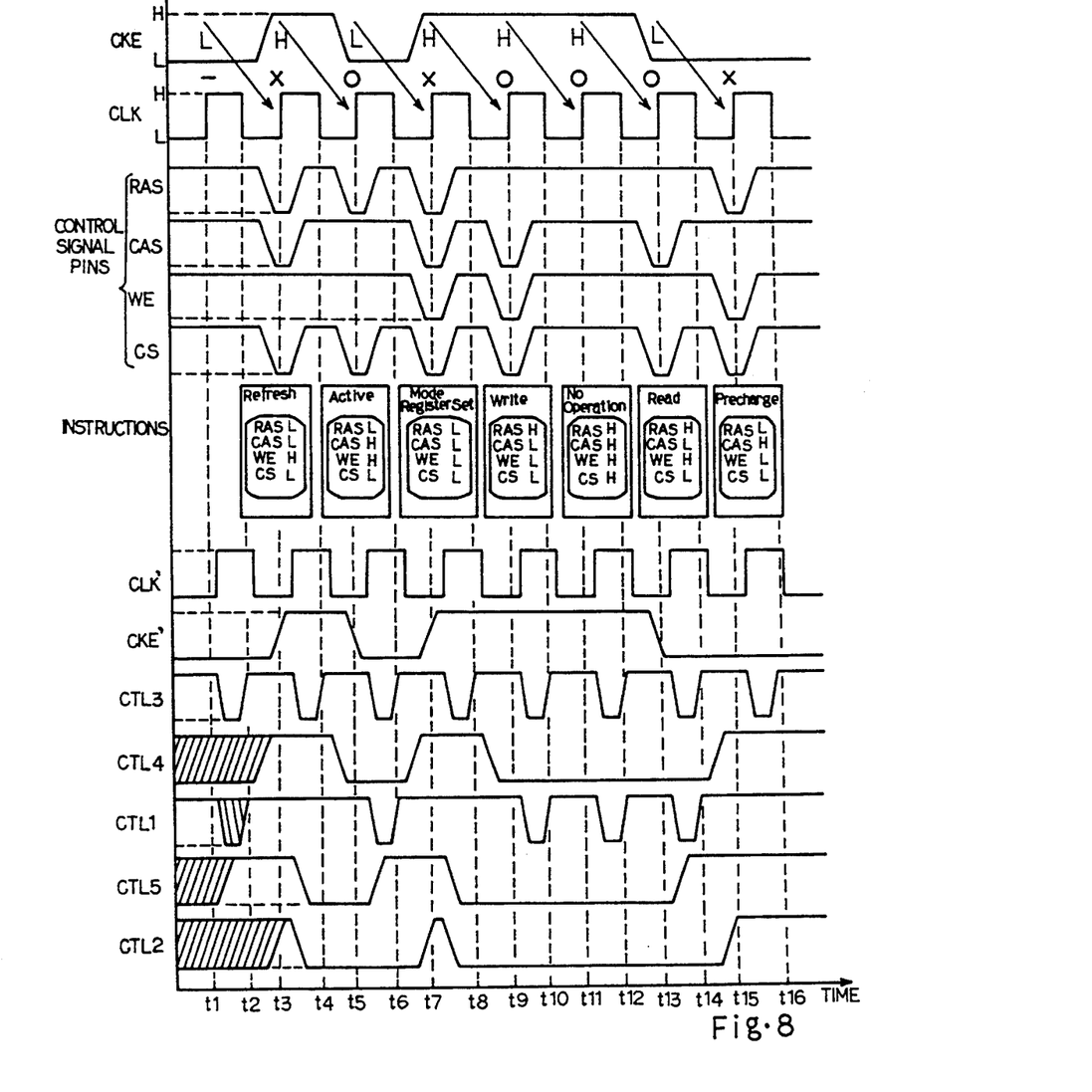
FIG. 8 is a timing chart showing the circuit behavior of the input circuit.

Description is hereinbelow made on a circuit behavior of the input circuit 170 with reference to FIG. 8, and the internal control signals and circuit components are labeled with the same references of those of the input circuit 1. The external command signals "Refresh", "Active", "Mode Register Set", "Write", "No Operation", "Read" and "Precharge" are represented by the levels at the control signals pins RAS, CAS, WE, CS as shown in FIG. 8.

The system clock signal CLK rises at times t1, t3, t5, t7, t9, . . . and decays at time t2, t4, t6, t8, t10, . . . The first and second input stages 11 and 12 introduce short time delays into propagation of the system clock CLK and propagation of the clock enable signal CKE', and supply the regulated clock signal CLK' and the regulated clock enable signal CKE' to the first and second controllers 13 and 14, respectively With the regulated clock signal CLK', the first one-shot pulse generator 13a produces the one-shot internal control signal CTL3 of the low level.

The delayed flip-flop circuit 14a produces the internal control signal CTL5 changed at every decay timing of the internal control signal CTL3 anti-phase to the regulated clock enable signal CKE', and the inverter IV18 coupled with the delayed latch circuit 14b produces the internal control signal CTL4 changed at every rising timing of the internal control signal CTL3 in anti-phase to the regulated clock signal CKE'.

Although the system clock signal rises at t1, the clock enable signal CKE is in the low level, and the main internal control signal CTL1 is in the low level indicative of disabled state. Namely, the delayed flip-flop circuit 14a latches the low level of the regulated clock enable signal CKE' in response to the internal control signal CTL3 of one-shot low level produced in synchronism with the system clock signal CLK at time t1, and supplies the internal control signal CTL4 after the pulse rise of the internal control signal CTL3. For this reason, even if the regulated clock signal CLK' rises after time t3, only the first one-shot pulse generator 13a produces the internal control signal CTL3, and the second one-shot pulse generator 13b keeps the main internal control signal CTL1 in the inactive high level. The internal control signal CTL4 prevents the synchronous dynamic random access memory device from hazard.

The regulated clock enable signal CKE' is in the high level indicative of the enable state immediately after time t3. The delayed flip flop circuit 14a latches the regulated clock enable signal CKE' in response to the internal control signal CTL3 after time t3, and the delayed latch circuit 14b changes the internal control signal CTL5 in synchronism with the pulse rise of the internal control signal CTL3. For this reason, the internal control signals CTL3 and CTL1 are produced after time t5. Since the internal control signal CTL4 is changed at the pulse rise of the internal control signal CTL3, the second one-shot pulse generator 13b keeps the level until the pulse rise of the later internal control signal CTL3. This is conducive to prevention from hazard.

Thus, the first and second one-shot pulse generators 13a and 13b simultaneously change the internal control signal CTL3 and CTL1, and the main internal control signal CTL1 continue the low level as long as the internal control signal CTL3. Therefore, even if the system clock signal CLK is variable in duty ratio, the main internal control signal CTL1 has a constant time period of the active level, and a margin for preventing from hazard does not rely on the time period of the high level of the system clock CLK. The margin is given by subtracting the time period of the low level of the internal control signal CTL3 from the pulse width of the system clock CLK.

The clock enable signal CKE causes the input circuit 170 to determine whether to produce the main internal control signal CTL1 or not. The level of the clock enable signal CKE at time t1 becomes valid at time t3, and the level of the clock enable signal at time t3 becomes valid at time t5. Thus, the second controller 14 introduces a time delay equivalent to one clock cycle of the system clock signal CLK between the change of the clock enable signal CKE and the validation of the clock enable signal CKE. In summary, the clock enable signal CKE demonstrates the ability one clock cycle later than the arrival at the control signal pin 17.

The timing generator 180 is responsive to the main internal control signal CTL1 for latching the external command signals at the control pins RAS, CAS, WE and CS.

The third controller behaves as follows. As described hereinbefore, the inverted signal CCKE' of the regulated clock signal CKE', the internal control signals CTL4 and CTL5 are supplied to the NAND gate 15c, and the low level of at least one signal CCKE', CTL4 or CTL5 causes the NAND gate 15c to produce the enable signal EBL of the low level. The internal control signal CTL3 determines the timings at which the second controller 14 produces the internal control signals CTL4 and CTL5 from the regulated clock enable signal CKE'. The enable signal EBL is supplied to the first and second input stages 11 and 12, and allows the p-channel enhancement type switching transistors Qp5/Qp6 Qp6 to turn on. The enable signal EBL is further supplied to first and second input stages associated with external signal port such as, for example, DP, and decreases the current consumption.

The current mirror circuit 11a introduces a time delay of several nano-second between the level change at the input nodes N1 and N2 and the level change at the output node N3, and the enable signal EBL is required to become low well before the change at the input nodes N1 and N2. Moreover, if the enable signal EBL is changed to the high level in the presence of the main internal control signal CTL1 of the active level, a malfunction is liable to take place, and the third controller 15 is expected to appropriately change the level of the enable signal EBL.

Since the activation and the inactivation of the first and second input stages with the external clock enable signal CKE are delayed by one clock cycle of the system clock CLK, and the enable signal EBL is changed to the high voltage level at the pulse rise of the internal control signal CTL3. For this reason, the pulse rise of the internal clock signal CTL4 is available for the change of the enable signal EBL to the high voltage level. On the other hand, the enable signal EBL is changed to the low voltage level in synchronism with the regulated clock enable signal CKE', because the regulated clock enable signal CKE' provides a sufficient time margin to the first and second input stages. Namely, assuming now that the time interval between time t1 and t3 defines a cycle, it is too late to activate the first input stage assigned to an input data signal by time t3, and the activation should be completed before the set-up time of the first input stage assigned to an input data signal, because the pulse decay of the internal control signal CTL3 produced in the previous cycle hardly provides a sufficient margin. However, if the regulated clock enable signal CKE' is used for the activation of the first and second input stages, the first and second input stages are activated in synchronism with the change of the clock enable signal CKE to the active level, and the activation of the first and second input stages are earlier by the set-up time of the clock enable signal CKE to the system clock signal CLK.

The reason why the internal control signal CTL5 is supplied to the third controller 15 is to guarantee the high level. The internal control signal CTL5 is indicative of the high level of the clock enable signal CKE after the recovery to the low level.

As will be understood from the foregoing description, the input circuit according to the present invention produces the one-shot main internal control signal with the constant time period at the low level regardless of the duty ratio of the system clock signal CLK, and the enable signal EBL decreases the current consumption of the first and second input stages.

Although particular embodiments of the present invention have been shown and described, it will be obvious to those skilled in the art that various changes and modifications may be made without departing from the spirit and scope of the present invention.

What is claimed is:

1. A synchronous semiconductor memory device comprising:
   a) a memory cell array implemented by a plurality of addressable memory cells;
   b) an input and output unit for supplying data bits from and to said memory cell array;
   c) an addressing system responsive to external address signals for selectively coupling said input and output unit with said plurality of addressable memory cells;

d) a timing generator responsive to external command signals for controlling said input and output unit and said addressing system; and e) an input circuit responsive to an external clock signal and an external clock enable signal for producing a main internal control signal, said main internal control signal causing said timing generator to latch said external command signals, said input circuit having e-1) a first input stage assigned to said external clock signal, and enabled with an enable signal, said first input stage being operative to produce an internal clock signal synchronous with said external clock signal, e-2) a second input stage assigned to said external clock enable signal, and enabled with said enable signal, said second input stage being operative to produce an internal clock enable signal synchronous with said external clock enable signal, e-3) a first controller responsive to said internal clock signal for producing a first internal control signal maintained at a first level for a predetermined time period, and e-4) a second controller responsive to said first internal control signal for introducing a time delay between said internal clock enable signal and a second internal control signal, said second internal control signal allowing said first controller to produce said main internal control signal from said internal clock signal maintained at the first level for said predetermined time period.

2. The synchronous semiconductor memory device as set forth in claim 1, in which further comprises f) a third controller responsive to said internal clock enable signal, said second internal control signal and a third internal control signal produced from said internal clock enable signal by said second controller for producing said enable signal, said enable signal being supplied to at least said first and second input stages for activating with electric power.

3. The synchronous semiconductor memory device as set forth in claim 1, in which said first controller comprises a first one-shot pulse generator having a delay circuit for introducing a predetermined time delay into said propagation of said internal clock signal for producing a first delayed internal clock signal and a logic gate supplied with said internal clock signal and said first delayed internal clock signal for producing said first internal control signal, and a second one-shot pulse generator having a delay circuit for introducing said predetermined time delay into propagation of said internal clock signal for producing a second delayed internal clock signal, and a logic gate supplied with said internal clock signal and said second delayed internal clock signal for producing said main internal control signal, said delay circuit of said second one-shot pulse generator having a logic gate being enabled with said second internal control signal.

4. The synchronous semiconductor memory device as set forth in claim 2, in which said first controller comprises a first one-shot pulse generator having a delay circuit for introducing a predetermined time delay into said propagation of said internal clock signal for producing a first delayed internal clock signal and a logic gate supplied with said internal clock signal and said first delayed internal clock signal for producing said first internal control signal, and a second one-shot pulse generator having a delay circuit for introducing said predetermined time delay into propagation of said internal clock signal for producing a second delayed internal clock signal, and a logic gate supplied with said internal clock signal and said second delayed internal clock signal for producing said main internal control signal, said delay circuit of said second one-shot pulse generator having a logic gate enabled with said second internal control signal.

5. The synchronous semiconductor memory device as set forth in claim 4, in which said second controller comprises a first delayed circuit responsive to said first internal control signal for producing said third internal control signal from said internal clock enable signal, and a second delayed circuit responsive to said first internal control signal for producing said second internal control signal from said third internal control signal.

* * * * *

UNITED STATES PATENT AND TRADEMARK OFFICE
CERTIFICATE OF CORRECTION

PATENT NO. : 5,444,667
DATED : Aug. 22, 1995
INVENTOR(S) : Takashi Obara

It is certified that error appears in the above-indentified patent and that said Letters Patent is hereby corrected as shown below:

Col. 4, line 28, delete "Qn5 and Qn6" and insert --Qp5 and Qp6--.

Col. 7, line 27, delete "CLK" and insert --CLK'--.

Col. 7, line 30, delete "CLK" and insert --CLK'--.

Col. 9, line 66, delete "Op6" (second occurrence).

Signed and Sealed this

Thirtieth Day of January, 1996

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO.   : 5,444,667
DATED        : August 22, 1995
INVENTOR(S)  : Takashi OBARA It is certified that error(s) appears in the above-identified patent and that said Letters Patent is hereby corrected as shown below:

On the title page, item [30]
Under Foreign Application Priority Data, please change the priority date of "April 20, 1993" to --April 2, 1993--.

Signed and Sealed this

Twelfth Day of March, 1996

Attest:

BRUCE LEHMAN

*Attesting Officer*       *Commissioner of Patents and Trademarks*